United States Patent
Minamio et al.

(10) Patent No.: US 7,153,042 B2
(45) Date of Patent: Dec. 26, 2006

(54) OPTIC DEVICE

(75) Inventors: Masanori Minamio, Osaka (JP); Tetsushi Nishio, Kyoto (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/152,253

(22) Filed: Jun. 15, 2005

(65) Prior Publication Data

US 2006/0083459 A1    Apr. 20, 2006

(30) Foreign Application Priority Data

Oct. 15, 2004  (JP)  ............... 2004-301831

(51) Int. Cl.
  G02B 6/36   (2006.01)
  G02B 6/42   (2006.01)
(52) U.S. Cl. ...................................... 385/92
(58) Field of Classification Search ............ None
  See application file for complete search history.

(56) References Cited

U.S. PATENT DOCUMENTS 7,025,511 B1 * 4/2006 Nakajima .............. 385/93

2004/0252951 A1 * 12/2004 Nagasaka et al. ............ 385/88

FOREIGN PATENT DOCUMENTS

JP    2000-058805 A    2/2000
JP    2002-043554 A    2/2002

* cited by examiner

*Primary Examiner*—Michelle Connelly-Cushwa
*Assistant Examiner*—Jerry T. Rahll
(74) *Attorney, Agent, or Firm*—McDermott Will & Emery LLP

(57) ABSTRACT

An optic device includes a base, an optical chip mounted on the base, and a transparent plate. A cylinder mirror in which an imaging optical system is incorporated is fitted on the base of the optic device, wherein a pair of positioning pins are provided at the bottom of the cylinder mirror. First positioning holes for defining a mounting position of the cylinder mirror to the base and second positioning holes having a smaller diameter than that of the first positioning holes for defining a mounting position of the optical chip to the base are formed in the base of the optic device.

17 Claims, 5 Drawing Sheets

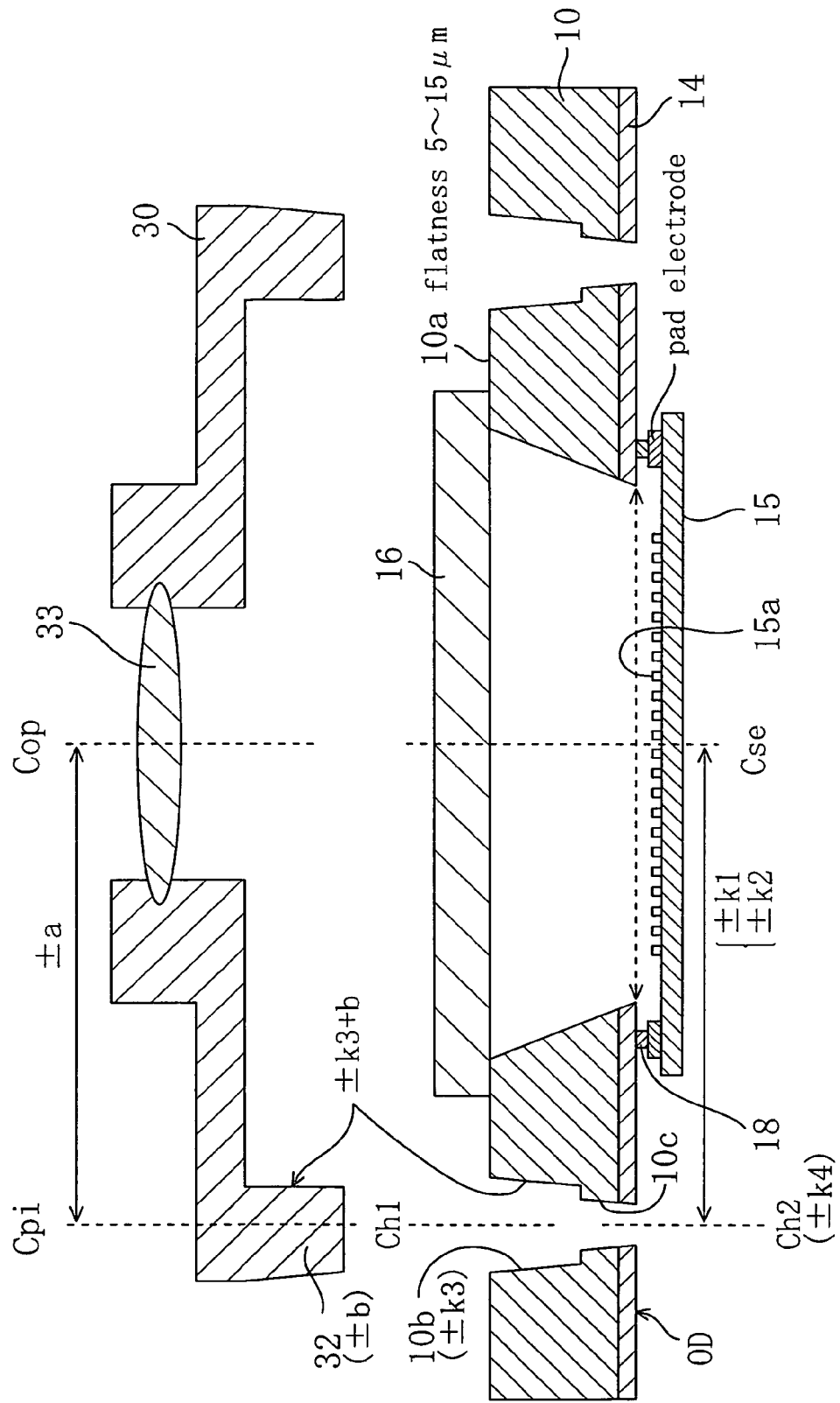

OPTIC DEVICE

CROSS REFERENCE TO RELATED APPLICATIONS

This Non-provisional application claims priority under 35 U.S.C. §119(a) on Patent Application No. 2004-301831 filed in Japan on Oct. 15, 2004, the entire contents of which are hereby incorporated by reference.

BACKGROUND ART

The present invention relates to an optic device on which an optical chip used in optical pickup systems for CDs, DVDs, MDs, and cameras such as video camera, digital cameras, and digital still cameras is mounted.

Recently, optic devices incorporated in optical pickup systems for CDs, DVDs, MDs, and cameras such as video cameras, digital cameras, and digital still cameras are provided as package units in such a fashion that the principal face of the optic device is covered with a transparent plate with an optical chip mounted on a base of the optic device made of an insulating material.

FIG. 5 is a section showing a construction of a solid-state imaging device as one example of conventional optic devices (see Japanese Patent Application Laid Open Publication No. 2002-43554A). As shown in the drawing, the solid-state imaging device includes, as main members: a frame-like base 131 made of a thermosetting resin through the central part of which an aperture 132 is formed; a solid-state imaging element 135 composed of a CCD or the like mounted on the lower face of the base 131; a transparent plate 136 made of a glass and mounted on the upper face of the base 131 so as to face the solid-state imaging element 135 through the aperture 132; and an adhesive layer 140 for mechanically connecting the transparent plate 136 to the base 131.

On the lower face of the base 131, also, a wiring 134 composed of a gold-plated layer buried in the resin of the base 131 is provided. The solid-state imaging element 135 is mounted below the base 131 so that a light receiving region 135a of the solid-state imaging element 135 is exposed to the aperture 132.

In the solid-state imaging element 135, an electrode pad (not shown) is provided for transmitting and receiving a signal between the solid-state imaging element 135 and external equipment. An internal terminal portion of the wiring 134 is exposed at the end part thereof to the aperture 132, and the internal terminal portion of the wiring 134 and the electrode pad of the solid-state imaging element 135 are electrically connected with each other through a bump (protruding electrode) 138 interposed therebetween. Further, a solder ball 141 is attached to an external terminal portion of the wiring 134. The solid-state imaging element 135, the wiring 134, and the bump 138 are sealed by a sealing resin 137 provided around the solid-state imaging element 135 on the lower face of the base 131.

The thus constructed solid-state imaging device is mounted on a circuit substrate with the transparent plate 136 facing upward as shown in the drawing. A cylinder mirror in which an imaging optical system is incorporated is fitted on the base 131, as indicated by broken lines in the drawing.

As described above, the light receiving region 135a of the solid-state imaging element 135 is arranged in the aperture 132 when viewed in plan. Light from an object to be shot is collected in the light receiving region 135a of the solid-state imaging element 135 through the imaging optical system incorporated in the cylinder mirror, and is photoelectrically converted by the solid-state imaging element 135.

Another solid-state imaging device is known in which a concave portion is formed in a part of a base where a solid-state imaging element is mounted, different from the shape of the base 131 shown in FIG. 5 (see, for example, Japanese Patent Application Laid Open. Publication No. 2000-58805A).

Recently, optic devices in which a light receiving element and a light emitting element are provided are reduced to practice. In this case, a hologram is mounted on the base 131 rather than the transparent plate 136 (hologram unit).

Wherein, in the case where both the light receiving element and the light emitting element are arranged in the optic device, it is general to mount a comparatively small light emitting element on a light receiving element.

In the conventional solid-state imaging device shown in FIG. 5, however, extremely high accuracy is required in the positional relationship between a lens system incorporated in the cylinder mirror and the optic device, and therefore, optical axes must be adjusted under conditions that the cylinder mirror is mounted to the optical device. The adjustment of the optical axes necessitates cumbersome labor.

The devices in which a hologram is mounted on the base 131 rather than the transparent plate 136 involve the same problems.

SUMMARY OF THE INVENTION

The present invention has its object of providing an optic device which can be easily assembled with mounting position accuracies of an optical part and an optical chip ensued.

In an optic device according to the present invention, positioning holes serving as a reference for a mounting position of a member to be mounted to the optic device with respect to a base and positioning holes serving as a reference for a relative position of an optical chip with respect to the base are formed in the base, with a result that work for assembling the optic device to a system therefor is simplified and assembling accuracy is increased.

When a wiring pattern is provided at the base, the optical chip may be connected to the wiring pattern electrically by flip-chip bonding or through a metal wire.

When a flexible substrate bent along the base and having a wring pattern, and a frame body for fixing the flexible substrate to the base are provided further, the optical chip can be fixed to the base so as to be connected electrically to the wiring pattern of the flexible substrate.

In this case, also, the optical chip may be connected to the wiring pattern electrically by flip-chip bonding or through a metal wire.

The respective optical part positioning holes and the respective optical chip positioning holes may be formed coaxially so as to form respective stepped straight holes, stepped tapered holes, stepless tapered holes, or the like.

In the case where the optical part positioning holes and the optical chip positioning holes are tapered, formation of the tapered portions to have a gradient corresponding to a draft of a mold for the base simplifies the manufacturing process.

A transparent member may be a hologram or a transparent plate made of a glass or a resin.

BRIEF DESCRIPTION OF THE DRAWINGS

FIG. 2 is a section for explaining positioning precision in x, y, and z directions between the optic device and the cylinder mirror according to Embodiment 1.

DETAILED DESCRIPTION OF PREFERRED EMBODIMENTS (Embodiment 1)

Figure 1:
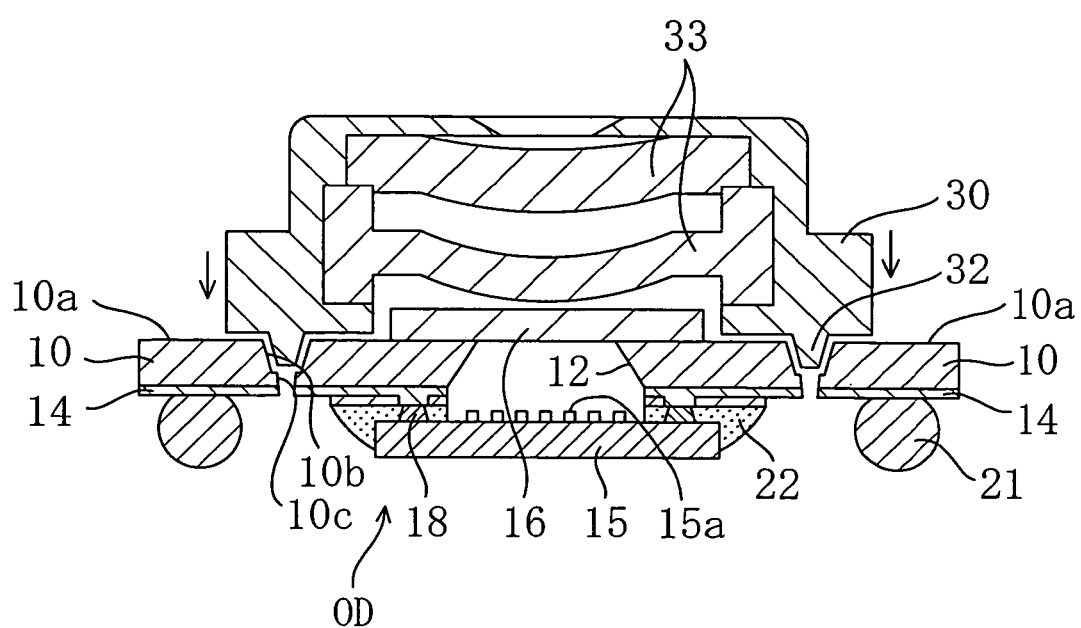
FIG. 1 is a section of an optic device and a cylinder mirror according to Embodiment 1.

FIG. 1 is a section of an optic device OD and a cylinder mirror 30 according to Embodiment 1. The optic device OD of the present embodiment includes, as main members: a frame-like base 10 made of a thermosetting resin such as epoxy resin and the like through the central part of which an aperture 12 is formed; an optical chip 15 mounted on the lower face of the base 10; a transparent plate 16 made of a glass and mounted on the upper face 10a of the base 10 through an adhesive layer (not shown) so as to face the optical chip 15 through the aperture 12. It is noted that the optical chip 15 of the present embodiment includes only a light receiving element such as a solid-state imaging element, but may include both a light receiving element and a semiconductor laser (light emitting element). In this case, for incorporating the optic device OD of the present embodiment into an optical pickup or the like, a hologram is mounted onto the base 10 after taking the transparent plate 16 away therefrom (hologram unit).

On the lower face of the base 10, a wiring 14 compose of a gold-plated layer is provided so as to be buried in the resin of the base 10. The optical chip 15 is mounted on the lower face of the base 10 so that a principal face 15a of the optical chip 15 is exposed to the aperture 12.

An electrode pad (not shown in FIG. 1; see FIG. 2) for transmitting and receiving a singal between the optical chip 15 and external equipment is provided on the optical chip 15. An internal terminal portion is formed at an end part of the wiring 14 so as to expose to the aperture 12, and the internal terminal portion of the wiring 14 and the electrode pad are connected with each other electrically through a bump (protruding electrode) 18 interposed therebetweeen. Further, a solder ball 21 is attached to an external terminal portion of the wiring 14. The optical chip 15, the wiring 14, and the bump 18 are sealed on the lower face of the base 10 by a sealing resin 22 provided around the optical chip 15. The optic device OD as shown in the drawing is mounted on a circuit substrate with the transparent plate 16 facing upward.

On the base 10 of the optic device OD, a cylinder mirror 30 in which an imaging optical system 33 is incorporated is fitted. A pair of positioning pins (pins) 32 are provided at the bottom of the cylinder mirror 30. A pair of first positioning holes 10b serving as optical part positioning holes for defining a mounting position of the cylinder mirror 30 to the base 10 are formed in the base 10 of the optic device OD. Further, a pair of second positioning holes 10c having a smaller diameter than that of the first positioning holes 10b and serving as optical chip positioning holes for defining a mounting position of the optical chip 15 to the base 10 are formed so as to be coaxial with the first positioning holes 10b, respectively. In the present embodiment, for mounting the optical chip 15 to the base 10, the centers of the second positioning holes 10c are obtained by measuring the inner peripheral positions of the second positioning holes 10c, respectively, and a relative position of the optical chip 15 with respect to the base 10 is determined so that the middle point between the centers agrees with the center of the optical chip 15. Thus, the second positioning holes 10c serve as a reference for positioning the optical chip 15 to the base 10 in the present embodiment.

The positioning holes 10b, 10c are formed in tapered shapes of which gradients correspond to a draft of a mold for the base 10 to form a stepped hole. In mounting the cylinder mirror 30 to the optic device OD, the pins 32 of the cylinder mirror 30 are fitted to the first positioning holes 10b, respectively, thereby defining the mounting position of the cylinder mirror 30.

The optical chip 15 is arranged so that the a principal face 15a thereof faces the aperture 12 when viewed in plan. Light from an object to be shot is collected in the principal face 15a of the optical chip 15 through the imaging optical system 33 incorporated in the cylinder mirror 30.

FIG. 2 is a section for explaining positioning accuracy in x, y, and z directions between the optic device OD and the cylinder mirror 30 of the present embodiment. In the drawing, the structures of the cylinder mirror 30 and the optic device OD are shown schematically, different from FIG. 1, and other member are illustrated also schematically.

Suppose that an accuracy of a distance between the optical axis Cop of the imaging optical system 33 and the center Cpi of each pin 32 of the cylinder mirror 30 is in the range within ±a (μm); an accuracy of a distance between the center Cse of the optical chip 15 (sensor) and each center Ch2 of the second positioning holes 10c is within ±k1 (μm); a mounting accuracy of the optical chip 15 is within ±k2 (μm); a tolerance of the diameter of each pin 32 is within ±b (μm); a tolerance of the diameter of each first positioning hole 10b is ±k3 (μm) (namely, a clearance between the respective pins 32 and the respective first positioning holes 10b is within ±k3+b (μm)); and an accuracy of the center of the first positioning holes 10b to the center of the second positioning holes 10c is within ±k4 (μm).

When the maximum diameter of each first positioning hole 10b and the minimum diameter of each second positioning hole 10c are 1500 μm and 100 μm, respectively, k1÷10 (μm), k2÷10 k3÷10 (μm), and k4÷2(μm) under the current manufacturing techniques. Accordingly, an accuracy in x and y directions of the optical axes (minimum squared tolerance) including the optical axis of the cylinder mirror 30 is:

$$\pm(10^2+10^2+2^2+(10+b)^2+a^2)^{-1/2}$$

As a result, the optic device OD of the present embodiment can ensure an accuracy of the optical axes within ±40 (μm). Also, the upper face 10a of the base 10 can be have a flatness of about 5 to 15 μm, thereby ensuring accuracy in z-direction of the optical axis.

In the present embodiment, the first positioning holes 10b and the second positioning holes 10c as the stepped holes are formed, respectively, to define the mounting position of the cylinder mirror 30 by the first positioning holes 10b and to define the mounting position of the optical device 15 by the second positioning holes 10c having a smaller diameter than that of the first positioning holes 10b. The formation of the two types of positioning holes 10b, 10c in the base 10 increases the positioning accuracy between the optical chip 15 and the imaging optical system 33 of the cylinder mirror 30, and in turn, increases the accuracy of the optical axes.

In general, accuracy of center detection increases as the diameter of the positioning holes becomes smaller. However, the diameter of the first positioning holes 10b is required to be large to some extent for the pins of the cylinder mirror 30 to be fitted thereto. On the other hand, the second positioning holes 10c are used only for optically detecting their centers, and therefore, the diameter thereof can be small principally as far as possible only if the optical center can be detected. In view of these characteristics of the positioning holes 10b, 10c, the second positioning holes 10c are set smaller in diameter than the first positioning holes 10b, thereby contemplating easy and speedy assembly with accuracy of the optical axis of the cylinder mirror 30 mounted on the optic device OD maintained high.

It is noted that in the case where the hologram is employed as a transparent member rather than the transparent plate 16, it is necessary to mount an optical part for arranging an objective lens on the hologram, and therefore, the same effects as in the present embodiment can be obtained.

Variation in Shape of Positioning Holes

Figure 3A:
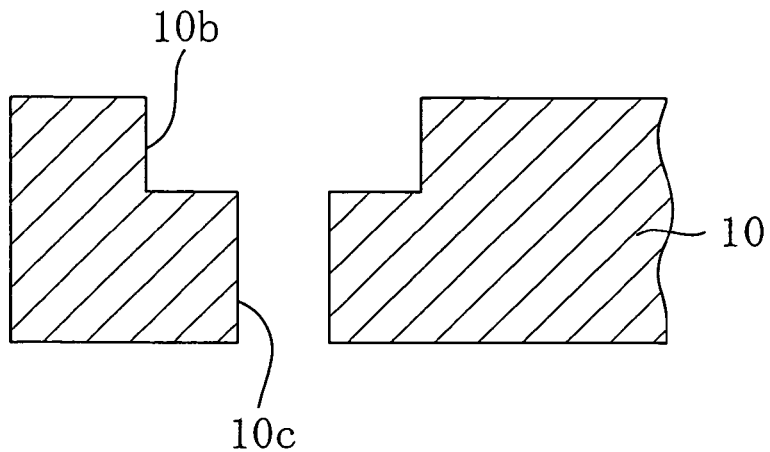
FIG. 3A to FIG. 3C are sections showing employable variation in shape of positioning holes.
Figure 3B:
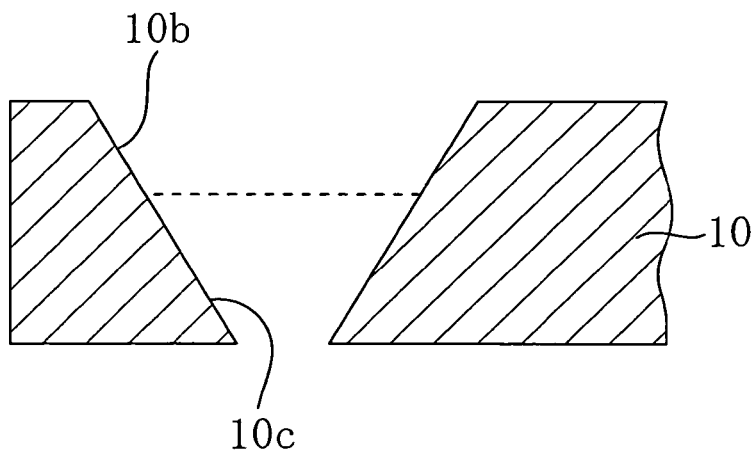
Figure 3C:
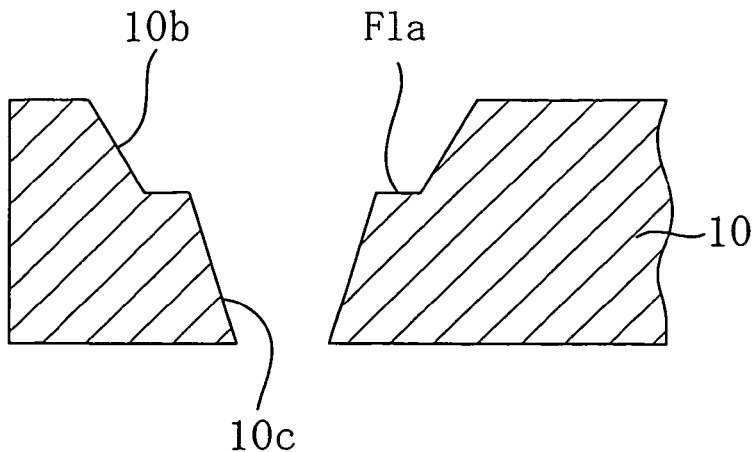

FIG. 3A to FIG. 3C are sections showing employable variation in shape of the positioning holes.

As shown in FIG. 3A, the first and second positioning holes 10b, 10c may be in straight forms to form a stepped hole. With this shape, in the case where the optical chip 15 is mounted above the base 10, the upper end of the second positioning hole 10c is optically detected to detect its center.

As shown in FIG. 3B, the first and second positioning holes 10b, 10c are formed integrally to form one smoothly tapered hole. In this case, the upper portion (part upper than the broken line in the drawing) of the one tapered hole serves as the first positioning hole 10b while the lower portion serves as the second positioning hole 10c.

FIG. 3C shows the first and second positioning holes 10b, 10c in tapered forms to form a stepped tapered hole as described with reference to FIG. 1. In comparison with FIG. 3B, the stepped tapered hole shown in FIG. 3C includes a flat portion Fla at the boundary between the first positioning hole 10b and the second positioning hole 10c, so that a position where the lower end of the pin 32 of the cylinder mirror 30 reaches is determined, increasing stability of assembly of the cylinder mirror 30. Further, the hole shown in FIG. 3C minimizes the diameter (minimum diameter) of the lower end of the second positioning hole 10c to increase the positioning accuracy of the optical chip 15.

Especially, when the gradients of the tapered forms of the respective positioning holes 10b, 10c corresponds to a draft of a mold for the base 10 in a molding process, the manufacturing process can be simplified.

(Embodiment 2)

Figure 4:
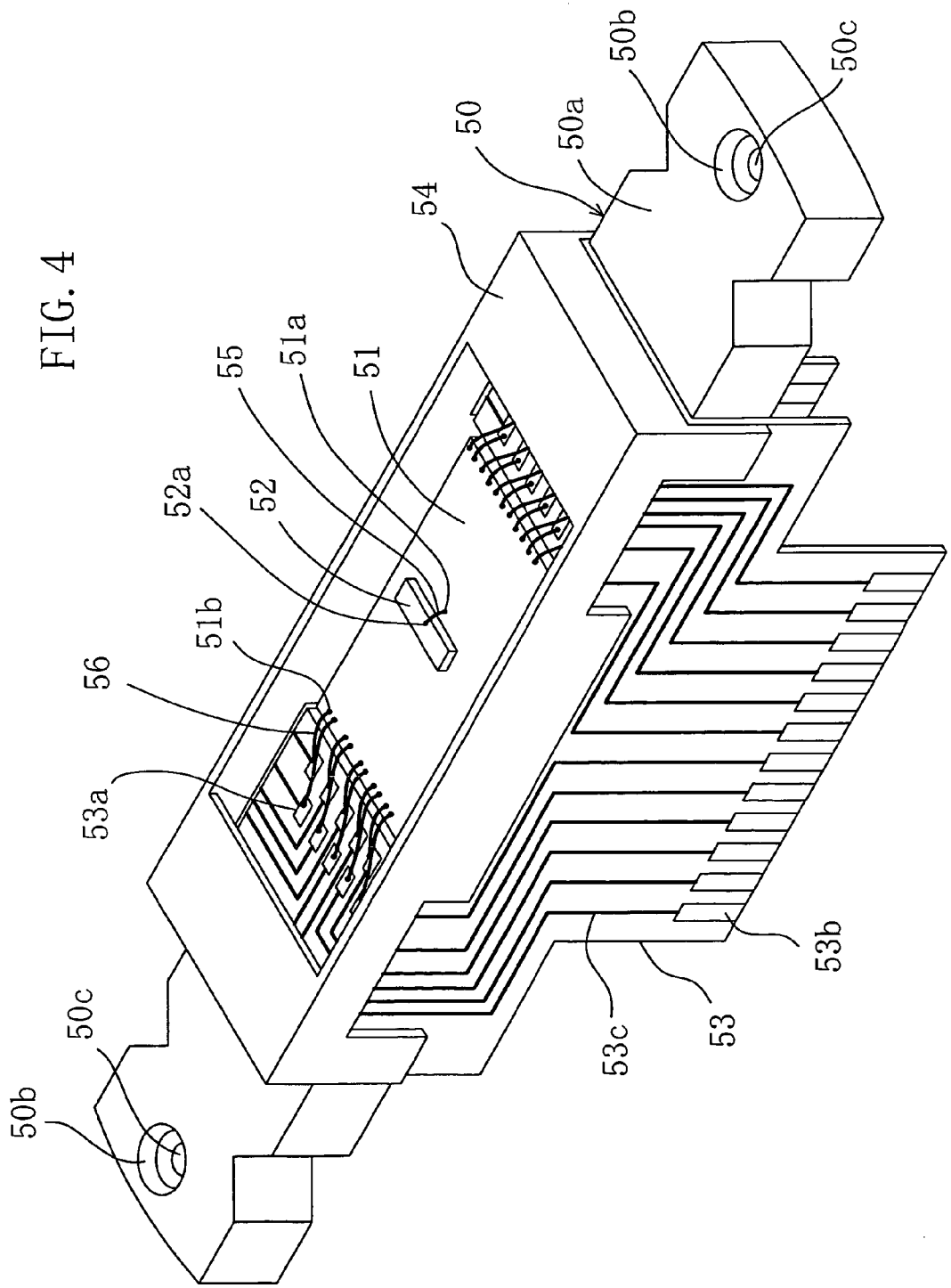
FIG. 4 is a perspective view showing a construction of an optic device according to Embodiment 2 of the present invention.
Figure 5:
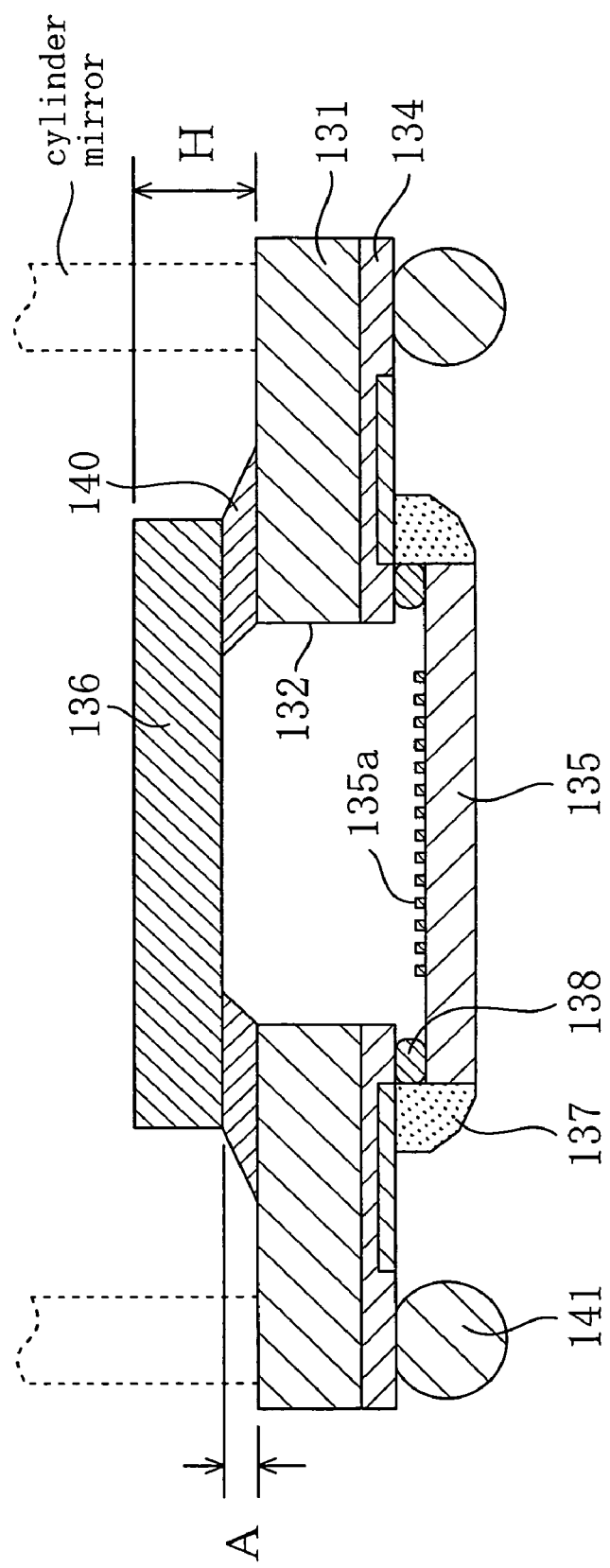
FIG. 5 is a section showing a construction of a conventional optic device.

FIG. 4 is a perspective view of an optic device according to Embodiment 2 of the present invention. Wherein, the hologram and the transparent plate are not shown in FIG. 4.

As shown in FIG. 4, the optic device of the present embodiment includes: a copper plate 50 serving as a base having a cooling function; an optical chip mounted on an upper face 50a of the copper plate 50 and carrying a light receiving element 51 and a light emitting element 52; a flexible substrate 53 bend so as to cover respective parts of the upper face 50a and the side face of the copper plate 50; and a positioning frame 54 of a metal frame body for fixing the flexible substrate 53 to the copper plate 50. The flexible substrate 53 is provided with an internal terminal 53a for signal connection between the light receiving element 51 and the light emitting element 52; an external terminal 53b for signal connection to external equipment; and a wiring pattern composed of a wiring (print wiring) 53c for connecting the internal terminal 53a and the external terminal 53b. The internal terminal 53a of the flexible substrate 53 and an outside pad electrode 51b of the light receiving element 51 are connected with each other electrically through a metal wire 56 serving as a signal connection member, and an inside pad electrode 51a of the optical chip and a pad electrode of the light emitting element 52a are connected with each other electrically through a metal wire 55 serving as a signal connection member. In short, both of the light receiving element 51 and the light emitting element 52 are connected to the wiring pattern of the flexible substrate 53 electrically. Both side portions of the flexible substrate 53 extend substantially perpendicularly to the upper face 50a of the copper plate 50. This substantially perpendicular extension means that the sides of the flexible substrate 53 are designed to extend perpendicular even if they shall lean to some degree due to an error or variation involved in actual manufacture. Wherein, they may extend obliquely to some degree so as to intersect with the upper face 50a of the copper plate 50.

Further, a pair of first positioning holes 50b serving as optical part positioning holes for defining a mounting position of an optical part such as a cylinder mirror and a pair of second positioning holes 50c serving as optical chip positioning holes for defining a mounting position of the optical chip are formed in the copper plate 50 so as to form one stepped hole.

An assembly process of the optic device according to the present embodiment will be performed by the following sequence. First, the flexible substrate 53, which is a flat plate still, is place on the copper plate 50 and they are fixed to each other by an adhesive. Then, after the flexible substrate 53 is bent along the sides of the copper plate 50, the copper plate 50 and the flexible substrate 53 are fixed to each other by fitting the metal positioning frame 54. Herein, a groove trench (not shown) approximately corresponding to the width of the flexible substrate 53 is formed in a side face of the copper plate 50, so as to determine the position of the flexible substrate 53. Then, the copper plate 50 is fitted into and adhered by an adhesive to the central portion of the side portions of the positioning frame 54 while the flexible substrate 53 is fitted into and adhered by an adhesive to the respective end portions of the side portion of the positioning frame 54.

Subsequently, the optical chip carrying the light receiving element 51 is fixed and adhered to the copper plate 50 by an adhesive, and then, the light emitting element 52 is fixed and adhered to the optical chip by an adhesive. Prior to the fixing and adhesion of the optical chip to the copper plate 50, each upper end of the second positioning holes 50c is detected optically to detect each center of the second positioning holes 50c. Next, the center of the optical chip is determined so as to agree with the middle point between the second positioning holes 50c, and then, the optical chip is fixed and adhered to the copper plate 50.

Thereafter, wire bonding is performed to connect to the internal terminal 53a of the flexible substrate 53 and the outside pad electrode 51b of the optical chip with each other electrically through the metal wire 55 and to connect the inside pad electrode 51a of the optical chip and the pad electrode 52a of the light emitting element 52 with each other electrically through the metal wire 56. In so doing, the optical device having the structure shown in FIG. 4 is obtained.

Though the process following the above step depends on whether the hologram is employed or not, the hologram, the transparent plate, or the like is mounted on the positioning frame 54.

Similar to Embodiment 1, simple and speedy assembly is contemplated with mounting accuracy of an optical part such as the cylinder mirror to be fitted to the optical device maintained high in the present embodiment.

(Other Embodiments)

Applicable filed of the positioning holes in the present invention is not limited to optic devices having the structure in Embodiments 1 or 2. Further, even if an optical chip is mounted on a base indirectly, namely if an optical chip is mounted on a base with another part intervened, the same effects as those in the present invention can be exhibited if an optical part such as a cylinder mirror is mounted to the base.

What is claimed is:

1. An optic device comprising:
   a base;
   an optical chip fixed to the base directly or indirectly;
   a transparent member mounted on or above the upper face of the base;
   a pair of optical part positioning holes formed in the base, between which the optical chip is arranged, for defining a mounting position of an optical part to be arranged above the transparent member; and
   a pair of optical chip positioning holes formed in the base, between which the optical chip is arranged, for defining a mounting position of the optical chip,
   wherein the optical part positioning hole and the optical chip positioning hole are formed coaxially to form a stepped hole.

2. The optic device of claim 1, further comprising;
   a wiring pattern provided at the base,
   wherein the optical chip is connected to the wiring pattern electrically by flip chip bonding.

3. The optic device of claim 1, further comprising;
   a wiring pattern provided at the base,
   wherein the optical chip is connected to the wiring pattern electrically through a metal wiring.

4. The optic device of claim 1, further comprising;
   a flexible substrate bent along the base and having a wiring pattern; and
   a frame body for fixing the base and the flexible substrate to each other,
   wherein the optical chip is fixed to the base and is connected electrically to the wiring pattern of the flexible substrate.

5. The optic device of claim 4, wherein
   the optical chip is connected to the wiring pattern electrically by flip chip bonding.

6. The optic device of claim 4, wherein
   the optical chip is connected to the wiring pattern electrically through a metal wire.

7. The optic device of claim 1, wherein the optical chip positioning hole has a diameter smaller than that of the optical part positioning hole.

8. The optic device of claim 1, wherein
   the optical part positioning hole is tapered.

9. The optic device of claim 1, wherein
   the optical chip includes a light receiving element and a light emitting element, and
   the transparent member is a hologram.

10. The optic device of claim 1, wherein the transparent member is a transparent plate.

11. An optic device comprising:
    a base;
    an optical chip fixed to the base directly or indirectly;
    a transparent member mounted on or above the upper face of the base;
    a pair of optical part positioning holes formed in the base, between which the optical chip is arranged, for defining a mounting position of an optical part to be arranged above the transparent member; and
    a pair of optical chip positioning holes formed in the base, between which the optical chip is arranged, for defining a mounting position of the optical chip, wherein
    the optical part positioning hole and the optical chip positioning hole are formed coaxially to form a stepless tapered hole.

12. An optic device comprising:
    a base;
    an optical chip fixed to the based directly or indirectly;
    a transparent member mounted on or above the upper face of the base;
    a pair of first holes formed in the base, between which the optical chip is arranged; and
    a pair of second holes formed in the base, between which the optical chip is arranged,
    wherein the first hole is formed on the upper face of the base;
    the second hole is formed on the lower face of the base; and
    the first hole and the second hole are connected together and form a through hole.

13. The optic device of claim 12, wherein the second hole has a diameter smaller than that of the first hole.

14. The optic device of claim 12, wherein the first hole and the second hole are formed coaxially.

15. An optic device comprising:
    a base;
    an optical chip fixed to the base directly or indirectly;
    a transparent member mounted on or above the upper face of the base;
    a pair of optical part positioning holes formed in the base, between which the optical chip is arranged, for defining a mounting position of an optical part to be arranged above the transparent member; and
    a pair of optical chip positioning holes formed in the base, between which the optical chip is arranged, for defining a mounting position of the optical chip,
    wherein the optical part positioning hole and the optical chip positioning hole are connected together and form a through hole.

16. The optic device of claim 15, wherein the optical part positioning hole and the optical chip positioning hole are formed coaxially.

17. The optic device of claim 15, wherein the through hole has a step.

* * * * *